US008058908B2

(12) United States Patent
Bae et al.

(10) Patent No.: US 8,058,908 B2
(45) Date of Patent: Nov. 15, 2011

(54) LEVEL DETECTOR, VOLTAGE GENERATOR, AND SEMICONDUCTOR DEVICE

(75) Inventors: Whi-Young Bae, Gwangju-si (KR); Byung-Chul Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/714,732

(22) Filed: Mar. 1, 2010

(65) Prior Publication Data
US 2010/0219880 A1    Sep. 2, 2010

(30) Foreign Application Priority Data
Mar. 2, 2009    (KR) .......................... 10-2009-0017681

(51) Int. Cl.
*G01R 19/00*    (2006.01)
(52) U.S. Cl. ................. 327/52; 327/53; 327/56; 327/77; 327/513
(58) Field of Classification Search ............... 327/51–54, 327/56, 77, 78, 536, 537, 512, 513; 363/59, 363/60
See application file for complete search history.

(56) References Cited

U.S. PATENT DOCUMENTS

| | | | | |
|---|---|---|---|---|
| 5,148,063 A * | 9/1992 | Hotta | ........................ | 365/185.21 |
| 5,280,198 A * | 1/1994 | Almulla | ........................ | 327/535 |
| 5,504,443 A * | 4/1996 | Gross et al. | ...................... | 327/51 |
| 5,565,799 A * | 10/1996 | Houston | ........................ | 327/52 |
| 5,638,322 A * | 6/1997 | Lacey | ........................ | 365/185.2 |
| 5,677,643 A * | 10/1997 | Tomita | ........................... | 327/78 |
| 5,856,748 A * | 1/1999 | Seo et al. | ........................ | 327/53 |
| 5,936,432 A * | 8/1999 | Oh et al. | ........................ | 327/55 |
| 6,124,732 A * | 9/2000 | Zilic et al. | ........................ | 326/63 |
| 6,219,290 B1 * | 4/2001 | Chang et al. | ................... | 365/207 |
| 6,381,187 B1 * | 4/2002 | Lee et al. | .................. | 365/189.15 |
| 6,400,606 B1 * | 6/2002 | Cho | ........................... | 365/185.2 |
| 6,424,578 B2 * | 7/2002 | Sim et al. | ................. | 365/189.09 |
| 6,456,555 B2 * | 9/2002 | Sim et al. | ....................... | 365/226 |
| 6,690,226 B2 | 2/2004 | Takai | | |
| 7,123,078 B2 * | 10/2006 | Seo | ............................... | 327/536 |
| 7,349,190 B1 * | 3/2008 | Maheedhar et al. | ............ | 361/92 |
| 7,366,048 B2 | 4/2008 | Byeon | | |
| 7,813,201 B2 * | 10/2010 | Fort et al. | ....................... | 365/208 |
| 2006/0181334 A1 * | 8/2006 | Do | ................................. | 327/538 |
| 2010/0008159 A1 * | 1/2010 | Fort et al. | .................. | 365/189.07 |
| 2011/0026347 A1 * | 2/2011 | Fort et al. | ....................... | 365/207 |

FOREIGN PATENT DOCUMENTS

| | | |
|---|---|---|
| JP | 2001-332696 | 11/2001 |
| KR | 1020010107692 | 12/2001 |
| KR | 1020070002782 | 1/2007 |
| KR | 1020070084879 | 8/2007 |

* cited by examiner

*Primary Examiner* — Lincoln Donovan
*Assistant Examiner* — William Hernandez
(74) *Attorney, Agent, or Firm* — F. Chau & Associates, LLC

(57) ABSTRACT

A level detector, a voltage generator, and a semiconductor device are provided. The voltage generator includes a level detector that senses the level of an output voltage to output a sensing signal and a voltage generating unit that generates the output voltage in response to the sensing signal. The level detector may include a first reference voltage generator configured to divide a first voltage and to output a first reference voltage, a second reference voltage generator configured to divide a second voltage in response to the output voltage and to output a second reference voltage that varies as a function of temperature, and a differential amplifier configured to receive the first and second reference voltages and to output a sensing signal in response to a sensing voltage generated by amplifying a difference between the first and second reference voltages.

19 Claims, 6 Drawing Sheets

LEVEL DETECTOR, VOLTAGE GENERATOR, AND SEMICONDUCTOR DEVICE

CROSS-REFERENCE TO RELATED APPLICATION

This application claims under 35 U.S.C. §119 priority to and the benefit of Korean Patent Application No. 10-2009-0017681, filed on Mar. 2, 2009, the entire content of which is incorporated by reference herein.

BACKGROUND

1. Technical Field

The present disclosure relates to voltage generators, and more specifically, to a level detector in which the sensing level varies as a function of temperature, a voltage generator having the same and a semiconductor device having the voltage generator.

2. Discussion of Related Art

In general, semiconductor devices include various voltage generators. For example, a semiconductor memory device can include a high voltage generator, an internal voltage generator, a substrate bias voltage generator, and the like. Further, the voltage generators generally include a level detector which senses a generated voltage to output a sensing signal. For example, the substrate bias voltage generator generates a substrate bias voltage Vbb applied to a p-type well in which an NMOS transistor constituting a cell transistor or sense amplifier of the semiconductor memory device is formed, and the substrate bias voltage Vbb generally has a negative voltage level. Therefore, the substrate bias voltage generator includes a level detector which senses the level of the substrate bias voltage Vbb to output a sensing signal that is activated when the substrate bias voltage Vbb reaches a predetermined level or more.

SUMMARY

Exemplary embodiments of the inventive concept provide a level detector in which the sensing level varies as a function of temperature.

Exemplary embodiments of the inventive concept also provide a voltage generator that includes a level detector in which the sensing level varies as a function of temperature, and generates a voltage that varies as a function of temperature.

Exemplary embodiments of the inventive concept further provide a semiconductor device that includes a voltage generator generating a voltage that varies as a function of temperature.

According to an exemplary embodiment a level detector includes a first reference voltage generator configured to divide a first voltage and to output a first reference voltage, a second reference voltage generator configured to divide a second voltage in response to a detected voltage and to output a second reference voltage that varies as a function of temperature, and a differential amplifier configured to receive the first reference voltage and the second reference voltage and to output a sensing signal in response to a sensing voltage generated by amplifying a difference between the first reference voltage and the second reference voltage.

The first voltage of the level detector may be a variable voltage whose voltage level increases when the temperature decreases, and the second voltage of the level detector may be a variable voltage whose voltage level decreases when the temperature decreases.

According to an exemplary embodiment a voltage generator includes a level detector configured to sense the level of an output voltage and to output a sensing signal, and a voltage generating unit configured to generate the output voltage in response to the sensing signal. The level detector includes a first reference voltage generator configured to divide a first voltage and to output a first reference voltage, a second reference voltage generator configured to divide a second voltage in response to the output voltage and to output a second reference voltage that varies as a function of temperature, and a differential amplifier configured to receive the first reference voltage and the second reference voltage and to output a sensing signal in response to a sensing voltage that is generated by amplifying a difference between the first reference voltage and the second reference voltage.

The output voltage of the voltage generating unit may be a substrate bias voltage.

The voltage generating unit may include an oscillator configured to output an oscillation signal in response to the sensing signal, and a charge pump configured to pump charges in response to the oscillation signal to decrease the output voltage.

The second reference voltage generator may include a first PMOS transistor that is connected between the second voltage and a terminal that outputs the second reference voltage, has a gate that receives the second reference voltage and that has a drain-source resistance that does not vary as a function of temperature, and a second PMOS transistor that is connected between the terminal that outputs the second reference voltage and a ground voltage, has a gate that receives the output voltage and that has a drain-source resistance that decreases when the temperature decreases.

The first voltage and the second voltage of the voltage generator may be at a constant voltage that do not vary as a function of temperature.

The first voltage of the voltage generator may be a constant voltage that does not vary as a function of temperature, and the second voltage of the voltage generator may be a variable voltage that decreases when the temperature decreases.

The first voltage of the voltage generator may be a variable voltage that increases when the temperature decreases, and the second voltage of the voltage generator may be a constant voltage that does not vary as a function of temperature.

The first voltage of the voltage generator may be a variable voltage that increases when the temperature decreases, and the second voltage of the voltage generator may be a variable voltage that decreases when the temperature decreases.

According to an exemplary embodiment a semiconductor device includes a voltage generator that includes a level detector configured to sense a level of an output voltage and to output a sensing signal, and a voltage generating unit configured to generate the output voltage in response to the sensing signal. The level detector includes a first reference voltage generator configured to divide a first voltage and to output a first reference voltage, a second reference voltage generator configured to divide a second voltage in response to the output voltage and to output a second reference voltage that varies as a function of temperature, and a differential amplifier configured to receive the first reference voltage and the second reference voltage and to output a sensing signal in response to a sensing voltage that is generated by amplifying a difference between the first reference voltage and the second reference voltage.

The semiconductor device may further include a memory cell array including at least one memory cell connected between a word line and a bit line. Each of the at least one memory cell may include a cell transistor, and the output voltage may be applied to the cell transistor as a substrate bias voltage.

The semiconductor device may further include a sense amplifier having at least one NMOS sense amplifier that includes a plurality of NMOS transistors and is configured to sense and to amplify a signal on a corresponding bit line. The output voltage may be applied to the NMOS transistor as a substrate bias voltage.

The output voltage of the semiconductor device may be a substrate bias voltage.

The voltage generating unit of the semiconductor device may include an oscillator configured to output an oscillation signal in response to the sensing signal, and a charge pump configured to pump charges in response to the oscillation signal to decrease the output voltage.

The second reference voltage generator of the semiconductor device may include a first PMOS transistor that is connected between the second voltage and a terminal that outputs the second reference voltage, has a gate that receives the second reference voltage and that has drain-source resistance that does not vary as a function of temperature, and a second PMOS transistor that is connected between the terminal that outputs the second reference voltage and a ground voltage, has a gate that receives the output voltage and that has a drain-source resistance that decreases when the temperature decreases.

The first voltage and the second voltage of the semiconductor device may be at a constant voltage that does not vary as a function of temperature.

The first voltage of the semiconductor device may be at a constant voltage that does not vary as a function of temperature, and the second voltage of the semiconductor device may be a variable voltage that decreases when the temperature decreases.

The first voltage of the semiconductor device may be a variable voltage that increases when the temperature decreases, and the second voltage of the semiconductor device may be a constant voltage that does not vary as a function of temperature.

The first voltage of the semiconductor device may be a variable voltage that increases when the temperature decreases, and the second voltage may be a variable voltage that decreases when the temperature decreases.

BRIEF DESCRIPTION OF THE DRAWINGS

Exemplary embodiments are described in further detail below with reference to the accompanying drawings. Like numbers refer to like elements throughout.

DETAILED DESCRIPTION OF THE EMBODIMENTS

Figure 1:
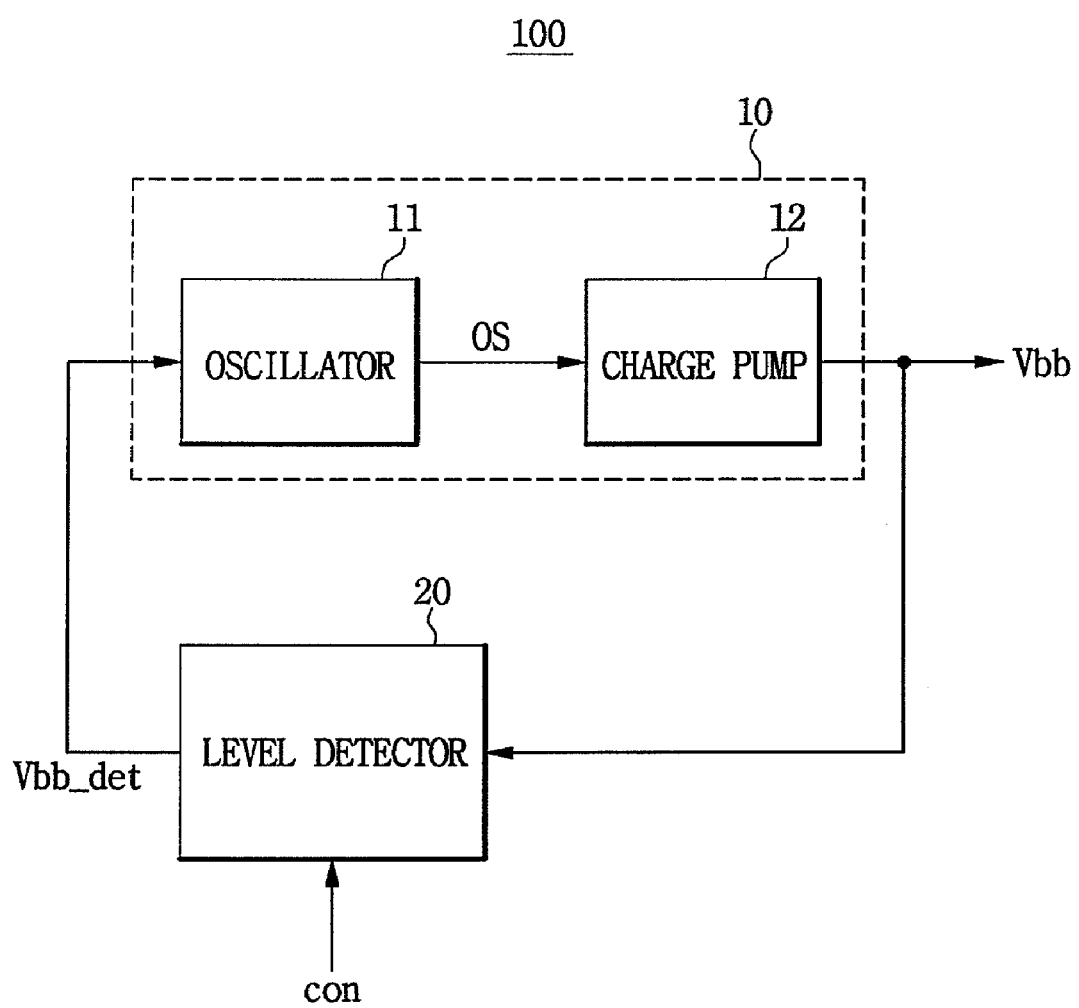
FIG. 1 is a diagram showing an exemplary embodiment of a voltage generator according to the inventive concept.

Various exemplary embodiments, which relate to a level detector, a voltage generator having the same, and a semiconductor device having the voltage generator, will now be described more fully with reference to the accompanying drawings. However, the present inventive concept may be embodied in many alternate forms and should not be construed as limited to only exemplary embodiments set forth herein.

Accordingly, while exemplary embodiments are capable of various modifications and alternative forms, embodiments thereof are shown by way of example in the drawings and will herein be described in detail. It should be understood, however, that there is no intent to limit the exemplary embodiments to the particular forms disclosed, but on the contrary, exemplary embodiments are to cover all modifications, equivalents, and alternatives falling within the scope of the inventive concept.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

FIG. 1 is a diagram showing the configuration of a substrate bias voltage generator 100 as an exemplary embodiment of a voltage generator according to the inventive concept. The substrate bias voltage generator 100 may include a voltage generating unit 10 and a level detector 20. The voltage generator 10 may include an oscillator 11 and a charge pump 12.

The voltage generating unit 10 generates a substrate bias voltage Vbb in response to a sensing signal Vbb_det output from the level detector 20. The oscillator 11 outputs an oscillation signal OS in response to the sensing signal Vbb_det. For example, the oscillator 11 may be configured such that when the sensing signal is activated, it outputs a clock-signal-type oscillation signal OS with a predetermined period. The charge pump 12 generates the substrate bias voltage Vbb in response to the oscillation signal OS. For example, the charge pump 12 may be configured such that as the charge pump 12 pumps charges in response to the oscillation signal OS, the absolute value of the output substrate bias voltage Vbb increases, that is, the level of the substrate bias voltage Vbb decreases.

The level detector 20 senses the level of the substrate bias voltage Vbb to output a sensing signal Vbb_det. For example, the level detector 20 may be configured to activate the sensing signal Vbb_det when the level of the substrate bias voltage Vbb becomes higher than a predetermined sensing level. The sensing level can vary as a function of temperature. For example, the sensing level may be set to increase when the temperature decreases.

That is, when the substrate bias voltage Vbb becomes higher than the sensing level that varies as a function of temperature, the voltage generator 100 shown in FIG. 1 operates the charge pump 12 to decrease the substrate bias voltage Vbb. Therefore, the voltage generator 100 can output the substrate bias voltage Vbb that varies as a function of temperature. If the sensing level is set to increase when the temperature decreases, the substrate bias voltage Vbb output from the voltage generator 100 also increases when the temperature decreases.

Figure 2:
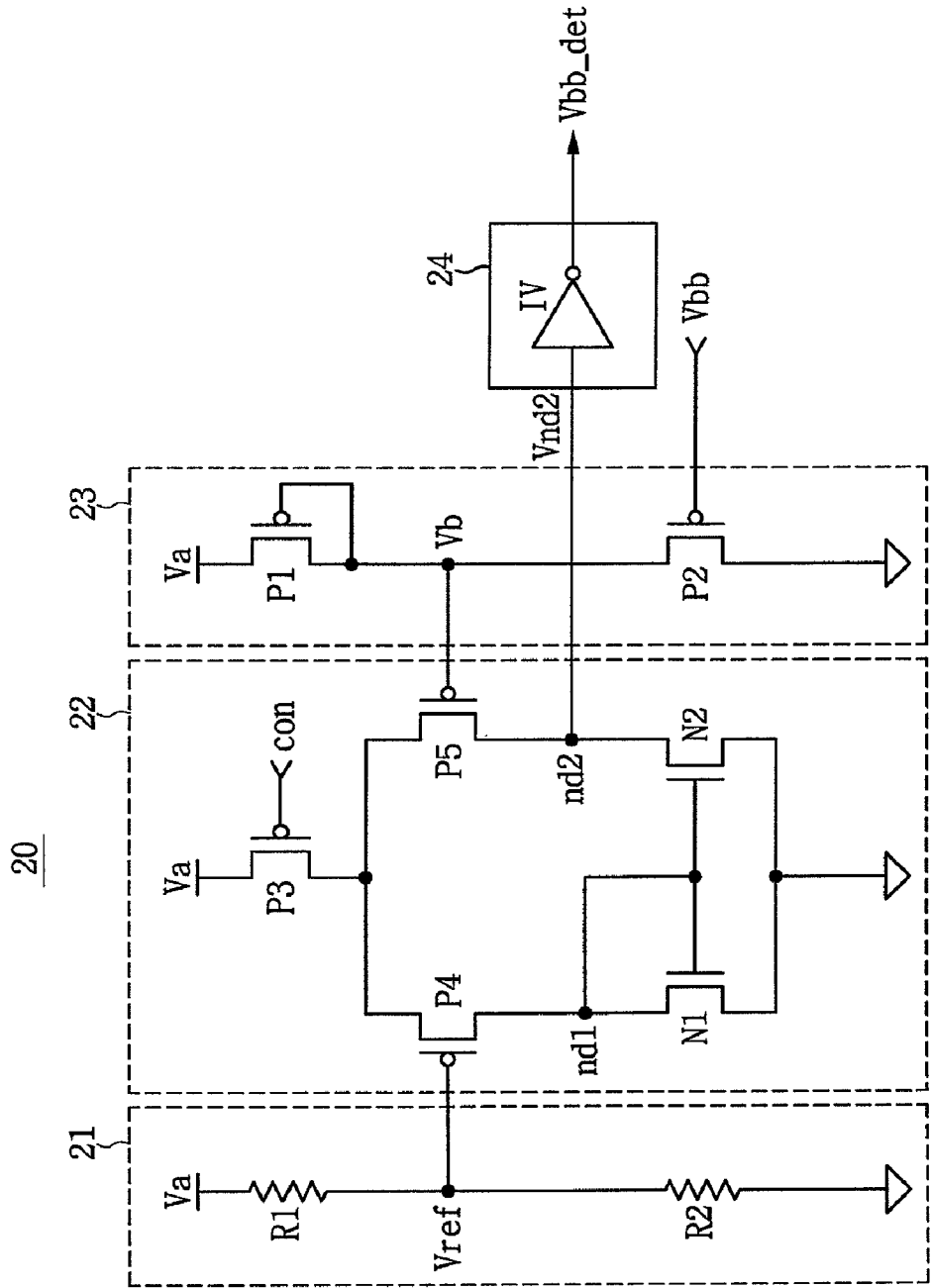
FIG. 2 is a diagram showing an exemplary embodiment of a level detector of the voltage generator shown in FIG. 1.

FIG. 2 is a diagram showing an exemplary embodiment of the level detector 20 of the voltage generator 100 shown in FIG. 1. The level detector 20 may include a first reference voltage generator 21, a differential amplifier 22, a second reference voltage generator 23, and a sensing signal generator 24. The first reference voltage generator 21 may include resistors R1, R2 connected between a constant voltage Va and a ground voltage, and the second reference voltage generator 23 may include a PMOS transistor P1, that is connected between the constant voltage Va and a terminal that outputs a second reference voltage Vb and has a gate that receives the second reference voltage Vb, and a PMOS transistor P2 that is connected between the terminal that outputs the second reference voltage Vb and the ground voltage and has a gate that receives the substrate bias voltage Vbb. Further, the differential amplifier 22 may include a current mirror type differential amplifier having PMOS transistors P3, P4, P5 and NMOS transistors N1, N2.

The first reference voltage generator 21 outputs a first reference voltage Vref in response to the constant voltage Va. As described above, the first reference voltage generator 21 may include the resistors R1, R2 connected in series between the constant voltage Va and the ground voltage. In this case, the first reference voltage generator 21 divides the constant voltage Va to output the first reference voltage Vref.

The second reference voltage generator 23 outputs a second reference voltage Vb that varies as a function of the constant voltage Va, the substrate bias voltage Vbb, and temperatures. The second reference voltage generator 23 may include the PMOS transistors P1, P2 connected in series between the constant voltage Va and the ground voltage. The PMOS transistor P1 is connected between the constant voltage Va and the terminal that outputs the second reference voltage Vb and has a gate that receives the second reference voltage Vb. Therefore, since the PMOS transistor P1 operates in a saturation range at all times, the magnitude of a drain-source current of the PMOS transistor P1 does not vary as a function of temperature, but is constant. That is, drain-source resistance of the PMOS transistor P1 has a fixed value that does not vary as a function of temperature. The PMOS transistor P2 is connected between the terminal that outputs the second reference voltage Vb and the ground voltage, and has a gate that receives the substrate bias voltage Vbb. Therefore, since a current flowing through the PMOS transistor P2 is varied by the substrate bias voltage Vbb, the second reference voltage Vb varies in response to the substrate bias voltage Vbb. Further, since a drain-source resistance component of the PMOS transistor P2 varies as a function of temperature, the level of the second reference voltage Vb also varies as a function of temperature. Further, the level of the second reference voltage Vb varies as a function of the magnitude of the constant voltage Va applied to the PMOS transistor P1.

The differential amplifier 22 outputs a differentially-amplified voltage of a node nd2 as a sensing voltage Vnd2. The differentially-amplified voltage varies in response to a voltage of a node nd1 which varies as a function of a difference between the first reference voltage Vref and the second reference voltage Vb. That is, when the second reference voltage Vb becomes larger than the first reference voltage Vref, a current flowing through the PMOS transistor P5 decreases, and thus a current flowing through the PMOS transistor P4 increases. Therefore, the voltage of the node nd1 increases. When the voltage of the node nd1 increases, currents flowing through the NMOS transistors N1, N2 increase, and thus the voltage of the node nd2, that is, the sensing voltage Vnd2 decreases. When the second reference voltage Vb becomes smaller than the first reference voltage Vref, a current flowing through the PMOS transistor P5 increases, and thus a current flowing through the PMOS transistor P4 decreases. Therefore, the voltage of the node nd1 decreases. When the voltage of the node nd1 decreases, currents flowing through the NMOS transistors N1, N2 decrease, and thus the voltage of the node nd2, that is, the sensing voltage Vnd2 increases.

The differential amplifier 22 may be enabled in response to a control signal con input from outside. That is, the PMOS transistor P3 of the differential amplifier 22 generates a driving current for driving the differential amplifier 22 in response to the control signal con. In other words, when a low-level control signal con is input, the PMOS transistor P3 generates a driving current to enable the differential amplifier 22. Further, when a high-level control signal con is input, the PMOS transistor P3 does not generate a driving current, and thus the differential amplifier 22 is disabled.

The sensing signal generator 24 outputs a sensing signal Vbb_det in response to the sensing voltage Vnd2. The sensing signal generator 24 may include an inverter IV. In this case, the sensing signal generator 24 outputs a low-level sensing signal Vbb_det when the sensing voltage Vnd2 has a level higher than a predetermined level, and a high-level sensing signal Vbb_det when the sensing voltage Vnd2 has a level lower than a predetermined level.

Figure 3:
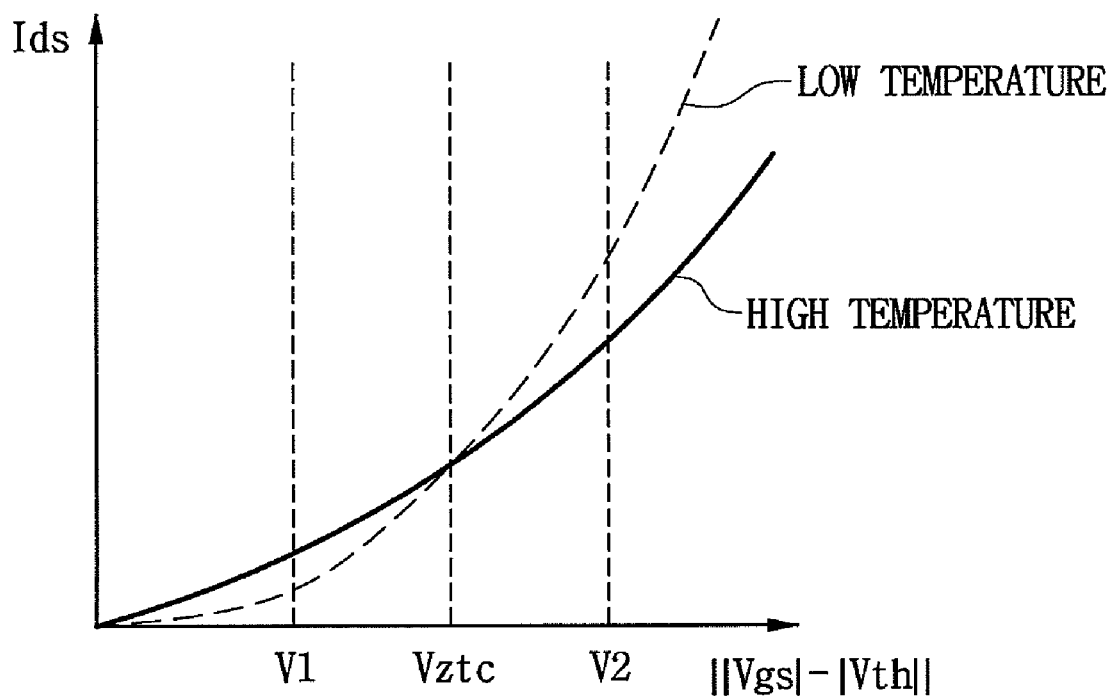
FIG. 3 is a graph illustrating the operation of the level detector of the voltage generator shown in FIG. 2, showing drain-source current versus a difference between a gate-source voltage of a transistor and a threshold voltage as a function of temperature.

FIG. 3 is a diagram illustrating the operation of the voltage generator 100 shown in FIG. 2. FIG. 3 shows drain-source current Ids versus a difference between a gate-source voltage of a transistor and a threshold voltage as a function of temperature.

By setting a gate-source voltage Vgs of a transistor to a small value, a bias point of the transistor is set to a lower side (for example, V1) of a voltage Vztc having a temperature coefficient of 0. Then, as shown in FIG. 3, a drain-source current Ids at a low temperature is smaller than that at a high temperature. That is, the threshold voltage of the transistor at a low temperature becomes larger than the threshold voltage of the transistor at a high temperature. In this case, when the temperature decreases, the drain-source current Ids decreases even though the same gate voltage is applied to the transistor. Then, a drain-source resistance component of the transistor increases.

On the other hand, when the bias point of the transistor is set to an upper side (for example, V2) of the voltage Vztc having a temperature coefficient of 0 by setting the gate-source voltage Vgs of the transistor to a large value, the drain-source current Ids at a low temperature is larger than the drain-source current Ids at a high temperature. That is, when the gate-source voltage Vgs of the transistor increases, electron flow is significantly disturbed by scattering of atoms at a high temperature. In this case, when the temperature decreases, the drain-source current Ids of the transistor increases even though the same gate voltage is applied to the transistor. Then, the drain-source resistance component of the transistor decreases.

Referring to FIGS. 2 and 3, the operation of the level detector 20 of the voltage generator 100 according to the inventive concept will now be described in more detail.

When the substrate bias voltage Vbb increases, the second reference voltage Vb increases, and thus the sensing voltage Vnd2 decreases. On the other hand, when the substrate bias voltage Vbb decreases, the second reference voltage Vb also decreases, and thus the sensing voltage Vnd2 increases. The sensing signal generator 24 outputs a low-level sensing signal Vbb_det when the sensing voltage Vdn2 has a level higher than a predetermined level, and a high sensing signal Vbb_det when the sensing voltage Vdn2 has a level lower than a predetermined level. That is, the level detector 20 of the voltage generator 100 shown in FIG. 2 activates the sensing signal Vbb_det to a high level when the substrate bias voltage Vbb reaches a predetermined level or more, and deactivates the sensing signal Vbb_det to a low level when the substrate bias voltage Vbb falls to a predetermined level or less. The sensing level may become the level of the substrate bias voltage Vbb which makes the level of the second reference voltage Vb identical to that of the first reference voltage Vref.

The substrate bias voltage Vbb is applied to the gate of the PMOS transistor P2, and the substrate bias voltage Vbb generally has a negative voltage level (about −0.7V). Further, the sensing voltage Vb generally has a positive voltage level (about 0.3-0.4V). Therefore, since a gate-source voltage Vgs of the PMOS transistor P2 has a large value, the bias point of the PMOS transistor P2 is set to an upper side (for example, V2) of the voltage Vztc having a temperature coefficient of 0. That is, when the temperature decreases, the resistance of the PMOS transistor P2 decreases, and thus the level of the second reference voltage Vb decreases. As a result, the substrate bias voltage Vbb increases, which makes the sensing level, that is, the level of the second reference level Vb identical to that of the first reference level Vref. That is, the level of the substrate bias voltage Vbb increases, at which the sensing signal Vbb_det is activated.

In other words, the voltage generator 100, according to the exemplary embodiments of the inventive concept shown in FIGS. 1 and 2, outputs the substrate bias voltage Vbb, in which the level increases when the temperature decreases using the level detector in which the sensing level increases when the temperature decreases.

FIG. 2 shows a case in which the first reference voltage generator 21, the differential amplifier 22, and the second reference voltage generator 23 are operated by the same constant voltage Va. However, power voltages applied to the first reference voltage generator 21, the differential amplifier 22, and the second reference voltage generator 23 may differ from one another. For example, a power voltage applied to the differential amplifier 22 may be an internal power voltage, and a power voltage applied to the first and second reference generators 21, 23 may be a constant voltage having a predetermined level which does not vary as a function of temperature.

Figure 4:
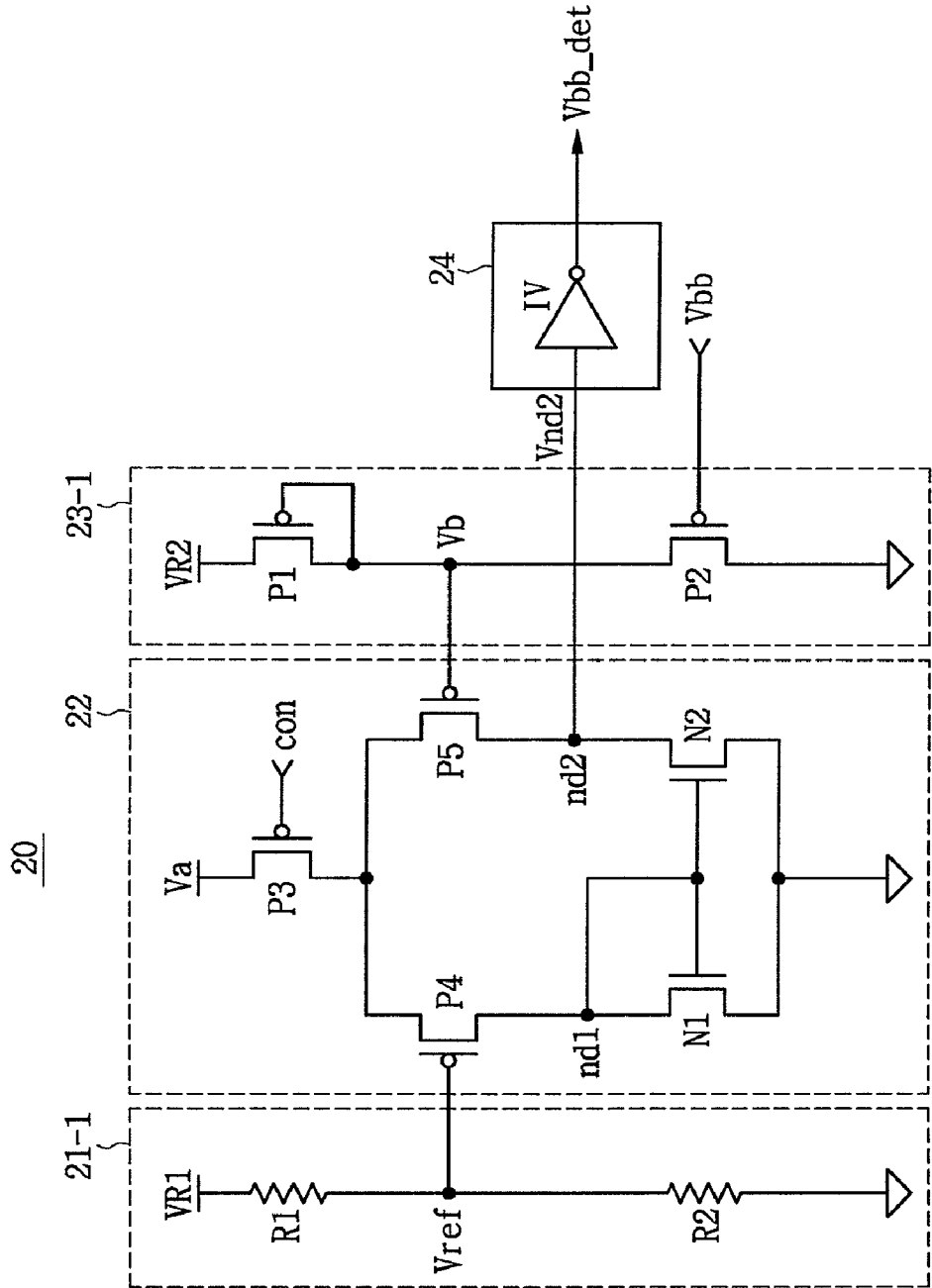
FIG. 4 is a diagram showing an exemplary embodiment of the level detector of the voltage generator shown in FIG. 1.

FIG. 4 is a diagram showing an exemplary embodiment of the level detector 20 of the voltage generator 100 shown in FIG. 1. The level detector 20 may include a first reference voltage generator 21-1, a differential amplifier 22, a second reference voltage generator 23-1, and a sensing signal generator 24.

The differential amplifier 22 and the sensing signal generator 24 may be configured in the same manner as described in FIG. 2, and carry out the same functions as described in FIG. 2.

The configuration and function of the first reference voltage generator 21-1 are the same as described in FIG. 2, except that the first reference voltage generator 21-1 outputs a first reference voltage Vref in response to a first variable voltage VR1, whose voltage level varies as a function of temperature. For example, the level of the first variable voltage VR1 may increase when the temperature decreases.

The configuration and function of the second reference voltage generator 23-1 are the same as described in FIG. 2, except that the second reference voltage generator 23-1 outputs a second reference voltage Vb in response to a second variable voltage VR2, in which the output level varies as a function of temperature. The level of the second variable voltage VR2 may decrease when the temperature decreases.

That is, the first reference voltage generator 21-1 of the exemplary embodiment of the level detector 20 shown in FIG. 4 outputs the first reference voltage Vref that varies as a function of temperature in response to the first variable voltage VR1. For example, as described above, the first variable voltage VR1 may be set such that the level of an output voltage increases when the temperature decreases. In this case, the level of the first reference voltage Vref also increases when the temperature decreases. Therefore, the sensing level of the level detector 20 increases when the temperature decreases.

The second reference voltage generator 23-1 of the exemplary embodiment of the level detector 20 shown in FIG. 4 outputs a second reference voltage Vb which varies in response to a second variable voltage VR2 that varies as a function of temperature as well as a substrate bias voltage Vbb. As described in FIGS. 2 and 3, the second reference voltage Vb varies in response to the temperature and the substrate bias voltage Vbb. Further, unlike in FIG. 2, the second variable voltage VR2, whose voltage level decreases when the temperature decreases, is applied to the second reference voltage generator 23-1 of FIG. 4. Therefore, when the temperature decreases, the magnitude of the second variable voltage VR2 as well as the resistance of the PMOS transistor P2 decreases. Accordingly, the level of the second reference voltage Vb increases more than in FIG. 2. As a result, the sensing level also increases more.

That is, the exemplary embodiment of the level detector 20 shown in FIG. 4 uses a variable voltage that varies as a function of temperature as a power voltage applied to the first and/or second reference voltage generator 21-1 and/or 23-1. Accordingly, the level detector 20 can increase the amount of change in sensing level as a function of temperature. Therefore, the level detector 20 can increase the amount of change in the substrate bias voltage Vbb as a function of temperature, the substrate bias voltage Vbb being output from the voltage generator 100 shown in FIG. 1.

Figure 5:
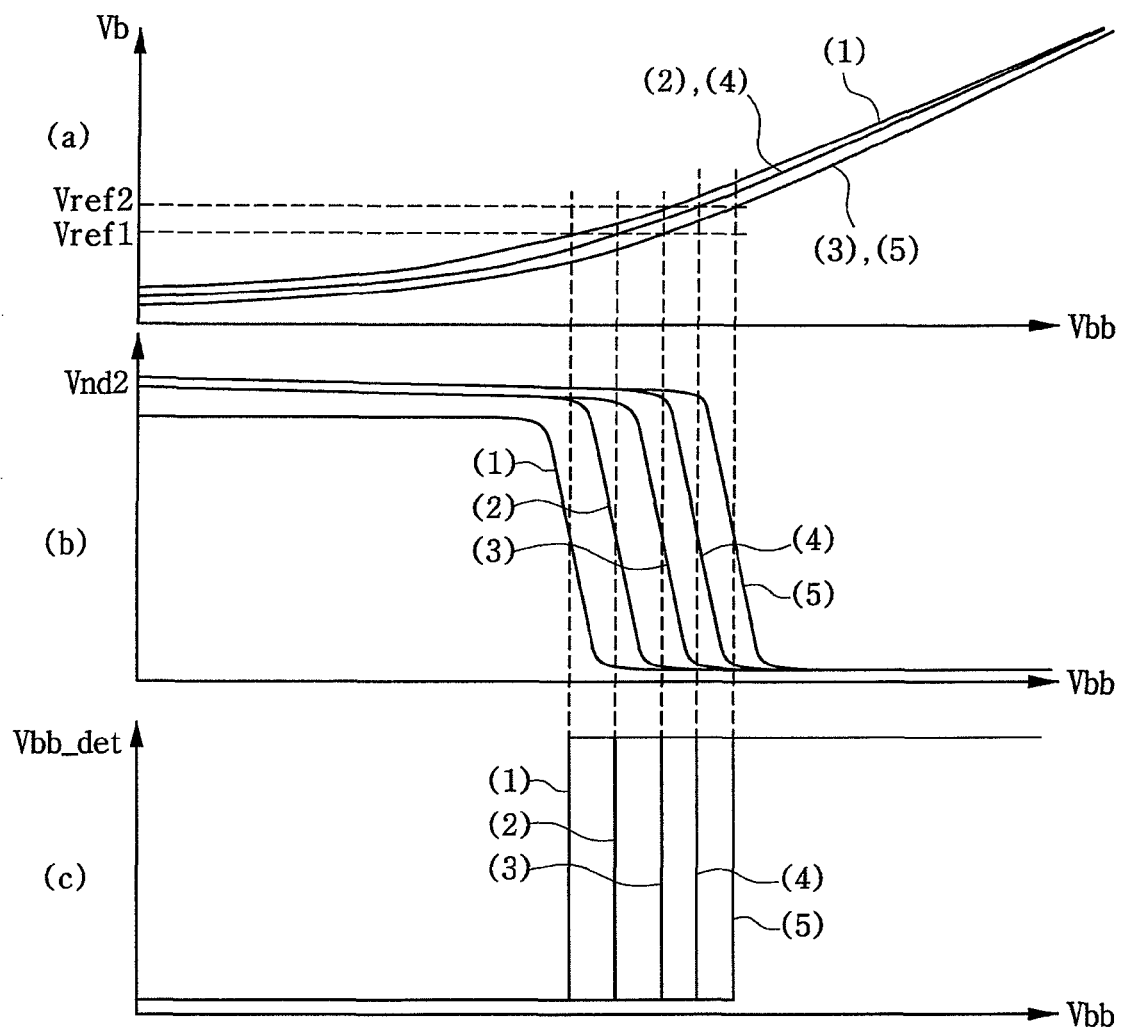
FIG. 5 shows simulation results of the level detector and the voltage generator having the same according to an exemplary embodiment of the inventive concept.

Table 1 below and FIG. 5 show simulation results of the level detector and the voltage generator 100 having the same exemplary embodiment according to the inventive concept. Graph (a) of FIG. 5 shows changes of the second reference signal Vb as a function of the substrate bias voltage Vbb. Graph (b) of FIG. 5 shows changes of the sensing voltage Vnd2 as a function of the substrate bias voltage Vbb. Graph (c) of FIG. 5 shows changes of the sensing signal Vbb_det as a function of the substrate bias voltage Vbb. Further, (1) indicates the case of high temperature, and (2) to (5) indicate the cases of low temperature. Among (2) to (5), (2) indicates the case in which the constant voltage is applied to all of the first reference voltage generator, the differential amplifier, and the second reference voltage generator; (3) indicates the case in which the constant voltage is applied to the first reference voltage generator and the differential amplifier, and the second variable voltage, in which the level decreases when the temperature decreases, is applied to the second reference voltage generator; (4) indicates the case in which the first variable voltage, in which the level increases when the temperature decreases, is applied to the first reference voltage generator, and the constant voltage is applied to the differential amplifier and the second reference voltage generator; and (5) indicates the case in which the first variable voltage is applied to the first reference voltage generator, the constant voltage is applied to the differential amplifier, and the second reference voltage is applied to the second reference voltage generator. In graph (a), Vref1 represents a reference voltage in the case of high temperature or when a power voltage of the first reference voltage generator is the constant voltage, and Vref2 represents a reference voltage at a low temperature when a power voltage of the first reference voltage generator is the first variable voltage.

TABLE 1

| Graph | Type of power voltage (First reference voltage generator/Differential amplifier/ Second reference voltage generator) | Change (mV) in sensing level at low temperature against high temperature |
|---|---|---|
| (1) | Constant voltage/Constant voltage/Constant voltage | 0 |
| (2) | Constant voltage/Constant voltage/Constant voltage | +100 |
| (3) | Constant voltage/Constant voltage/Second variable voltage | +200 |
| (4) | First variable voltage/Constant voltage/Constant voltage | +265 |
| (5) | First variable voltage/Constant voltage/Second variable voltage | +350 |

As shown in Table 1 and FIG. 5, the sensing level in case (2) (the case of low temperature) increases (about 100 mV) due to changes in resistance of the PMOS transistor P2 as a function of temperature, compared to the case of high temperature (that is, case (1)). In case (3), the second variable voltage is applied to the second reference voltage generator 23-1. Therefore, in the case of low temperature, the level of a power voltage of the second reference voltage generator 23-1, as well as the changes in resistance of the PMOS transistor P2, decreases. Accordingly, an increase (about 200 mV) of the sensing level becomes larger than in case (2). In case (4), the first variable voltage is applied to the first reference voltage generator 21-1. Therefore, in the case of low temperature, the level of a power voltage of the first reference voltage generator 21-1, as well as changes in resistance of the PMOS transistor P2, increases. Accordingly, an increase (about 265 mV) of the sensing level becomes larger than in case (2). In case (5), the first variable voltage is applied to the first reference voltage generator 21-1, and the second variable voltage is applied to the second reference voltage generator 23-1. Therefore, in the case of low temperature, the level of a power voltage of the first reference voltage generator 21-1, as well as changes in resistance of the PMOS transistor P2, increases, and the level of a power voltage of the second reference voltage generator 23-1 decreases. Accordingly, an increase (about 350 mV) of the sensing level becomes larger than in cases (3) and (4).

Further, the level of the substrate bias voltage Vbb increases, that is output as a function of the increase of the sensing level. That is, when the sensing level of the level detector 20 increases, the substrate bias voltage Vbb output from the voltage generating unit 10 also increases by the increase of the sensing level.

The change degree of the sensing voltage Vnd2 in graph (b) may vary as a function of current driving ability of the PMOS transistor P3. That is, when the PMOS transistor P3 can drive a sufficiently large amount of current, the sensing voltage Vnd2 can change more rapidly than that shown in graph (b).

Figure 6:
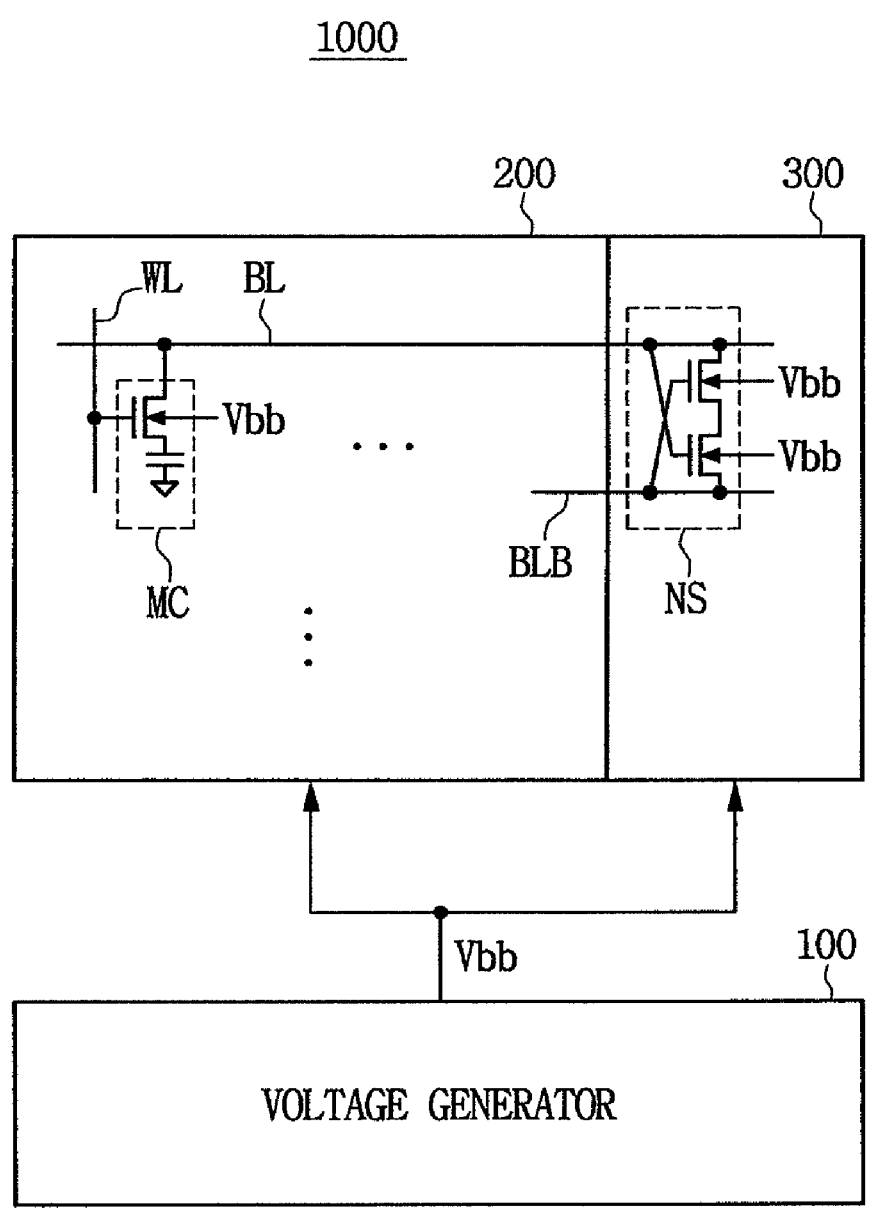
FIG. 6 is a diagram showing a semiconductor memory device having the voltage generator according to an exemplary embodiment of the inventive concept.

FIG. 6 is a diagram showing the configuration of a semiconductor memory device 1000 including the voltage generator 100 according to exemplary embodiments of the inventive concept. The semiconductor memory device 1000 may include the voltage generator 100, a memory cell array 200, and a sense amplifier 300.

The voltage generator 100 may have the same configuration as the exemplary embodiments in FIGS. 1 and 2, or 4. The internal voltage generator 100 outputs the substrate bias voltage Vbb that varies with temperature.

The memory cell array 200 may include at least one memory cell MC connected between a word line WL and a bit line BL, in which data is written or read to or from the memory cells MC.

The sense amplifier 300 senses and amplifies a signal on a corresponding bit line BL.

Each of the memory cells MC includes a cell transistor and a cell capacitor. The cell transistor may be an NMOS transistor. The sense amplifier 300 includes at least one NMOS sense amplifier NS. Each of the NMOS sense amplifiers NS includes a plurality of NMOS transistors. The substrate bias voltage Vbb generated by the voltage generator 100 is applied to the NMOS transistor constituting a cell transistor or sense amplifier of the semiconductor memory device as substrate bias voltage.

Although FIG. 6 illustrates the case where the voltage generator according to an exemplary embodiment of the inventive concept is applied to a semiconductor memory device, the voltage generator according to an exemplary embodiment of the inventive concept may also be applied to other semiconductor devices.

The level detector and the voltage generator having the same according to the above-described exemplary embodiments have been described by depicting a case in which the sensing level and the level of an output voltage increase when the temperature decreases. However, the level detector and the voltage generator may be configured such that the sensing level and the level of an output voltage decrease when the temperature decreases. For example, the bias point of the PMOS transistor P2 may be set to a lower side (for example, V1 of FIG. 3) of the voltage Vztc having a temperature coefficient of 0, the variable voltage applied to the first reference voltage generator may be set such that the level of an output voltage decreases when the temperature decreases, and the variable voltage applied to the second reference voltage generator may be set such that the level of an output voltage increases when the temperature decreases. Then, when the temperature decreases, the sensing level and the level of an output voltage decrease.

In an exemplary embodiment, the PMOS transistor P2 may be replaced by an NMOS transistor. For example, when a voltage output from the voltage generator has a high level, the PMOS transistor P2 may be replaced by an NMOS transistor.

Further, the differential amplifier 22 shown in FIGS. 2 and 4 may be configured in a complementary manner. For example, when the second reference voltage Vb has a high level, the differential amplifier 22 may include a PMOS transistor that is connected between a power voltage and a first node and has a gate receiving a voltage of the first node; a PMOS transistor that is connected between the power voltage and a second node and has a gate receiving a voltage of the first node; an NMOS transistor that is connected between the first node and a third node and has a gate receiving the first reference voltage Vref; an NMOS transistor that is connected between the second node and the third node and has a gate receiving the second reference voltage Vb; and an NMOS transistor that is connected between the third node and a ground voltage and has a gate receiving a control signal con. In this case, the differential amplifier 22 outputs a voltage of the second node as a sensing voltage.

Therefore, the level detector and the voltage generator according to the inventive concept can generate a voltage that varies as a function of temperature, and can easily increase the amount of change in the varying voltage.

As can be seen from the forgoing, a voltage generator including a level detector according to the exemplary embodiments of the inventive concept can generate a voltage that varies in a wide range as a function of temperature.

The foregoing is illustrative of exemplary embodiments and is not to be construed as limiting thereof. Although practical exemplary embodiments have been described, those skilled in the art will readily appreciate that many modifications are possible to the exemplary embodiments without materially departing from the novel teachings of the inventive concept. Accordingly, the exemplary embodiments, modifications to the exemplary embodiments, as well as other embodiments, are intended to be included within the scope of the appended claims.

What is claimed is:

1. A level detector comprising:
a first reference voltage generator configured to divide a first voltage and to output a first reference voltage;
a second reference voltage generator configured to divide a second voltage in response to a detected voltage and to output a second reference voltage that varies as a function of temperature; and
a differential amplifier configured to receive the first reference voltage and the second reference voltage and to output a sensing signal in response to a sensing voltage generated by amplifying a difference between the first reference voltage and the second reference voltage,
wherein the first voltage is a variable voltage whose voltage level increases when the temperature decreases, and the second voltage is a variable voltage whose voltage level decreases when the temperature decreases.

2. A voltage generator comprising:
a level detector configured to sense the level of an output voltage and to output a sensing signal; and
a voltage generating unit configured to generate the output voltage in response to the sensing signal,
wherein the level detector includes:
a first reference voltage generator configured to divide a first voltage and to output a first reference voltage;
a second reference voltage generator configured to divide a second voltage in response to the output voltage and to output a second reference voltage that varies as a function of temperature; and
a differential amplifier configured to receive the first reference voltage and the second reference voltage and to output a sensing signal in response to a sensing voltage generated by amplifying a difference between the first reference voltage and the second reference voltage.

3. The voltage generator according to claim 2, wherein the output voltage is a substrate bias voltage.

4. The voltage generator according to claim 3, wherein the voltage generating unit comprises:
an oscillator configured to output an oscillation signal in response to the sensing signal, and
a charge pump configured to pump charges in response to the oscillation signal to decrease the output voltage.

5. The voltage generator according to claim 4, wherein the second reference voltage generator comprises:
a first PMOS transistor connected between the second voltage and a terminal that outputs the second reference voltage and has a gate that receives the second reference voltage and that has a drain-source resistance that does not vary as a function of temperature; and
a second PMOS transistor connected between the terminal that outputs the second reference voltage and a ground voltage and has a gate that receives the output voltage and that has a drain-source resistance that decreases when the temperature decreases.

6. The voltage generator according to claim 5, wherein the first voltage and the second voltage are at a constant voltage that do not vary as a function of temperature.

7. The voltage generator according to claim 5, wherein the first voltage is a constant voltage that does not vary as a function of temperature, and the second voltage is a variable voltage that decreases when the temperature decreases.

8. The voltage generator according to claim 5, wherein the first voltage is a variable voltage that increases when the temperature decreases, and the second voltage is a constant voltage that does not vary as a function of temperature.

9. The voltage generator according to claim 5, wherein the first voltage is a variable voltage that increases when the temperature decreases, and the second voltage is a variable voltage that decreases when the temperature decreases.

10. A semiconductor device comprising:
a voltage generator comprising:
a level detector configured to sense a level of an output voltage and to output a sensing signal; and
a voltage generating unit configured to generate the output voltage in response to the sensing signal,
wherein the level detector includes:
a first reference voltage generator configured to divide a first voltage and to output a first reference voltage;
a second reference voltage generator configured to divide a second voltage in response to the output voltage and to output a second reference voltage that varies as a function of temperature; and
a differential amplifier configured to receive the first reference voltage and the second reference voltage and to output a sensing signal in response to a sensing voltage that is generated by amplifying a difference between the first reference voltage and the second reference voltage.

11. The semiconductor device according to claim 10, further comprising:
a memory cell array including at least one memory cell connected between a word line and a bit line,
wherein each of the at least one memory cell includes a cell transistor, and the output voltage is applied to the cell transistor as a substrate bias voltage.

12. The semiconductor device according to claim 11, further comprising:
a sense amplifier having at least one NMOS sense amplifier that includes a plurality of NMOS transistors and is configured to sense and to amplify a signal on a corresponding bit line,
wherein the output voltage is applied to the NMOS transistor as a substrate bias voltage.

13. The semiconductor device according to claim 10, wherein the output voltage is a substrate bias voltage.

14. The semiconductor device according to claim 13, wherein the voltage generating unit comprises:
- an oscillator configured to output an oscillation signal in response to the sensing signal; and
- a charge pump configured to pump charges in response to the oscillation signal to decrease the output voltage.

15. The semiconductor device according to claim 14, wherein the second reference voltage generator comprises:
- a first PMOS transistor that is connected between the second voltage and a terminal that outputs the second reference voltage, has a gate that receives the second reference voltage and that has a drain-source resistance that does not vary as a function of temperature; and
- a second PMOS transistor that is connected between the terminal that outputs the second reference voltage and a ground voltage, has a gate that receives the output voltage and that has a drain-source resistance that decreases when the temperature decreases.

16. The semiconductor device according to claim 15, wherein the first voltage and the second voltage are at a constant voltage that does not vary as a function of temperature.

17. The semiconductor device according to claim 15, wherein the first voltage is at a constant voltage that does not vary as a function of temperature, and the second voltage is a variable voltage that decreases when the temperature decreases.

18. The semiconductor device according to claim 15, wherein the first voltage is a variable voltage that increases when the temperature decreases, and the second voltage is a constant voltage that does not vary as a function of temperature.

19. The semiconductor device according to claim 15, wherein the first voltage is a variable voltage that increases when the temperature decreases, and the second voltage is a variable voltage that decreases when the temperature decreases.

* * * * *